(12) United States Patent
Byers et al.

(10) Patent No.: US 6,457,067 B1
(45) Date of Patent: Sep. 24, 2002

(54) SYSTEM AND METHOD FOR DETECTING FAULTS IN STORAGE DEVICE ADDRESSING LOGIC

(75) Inventors: Larry L. Byers, Apple Valley; Jerome G. Carlin, St. Paul; Michael R. Overley, Maple Grove; Gary R. Robeck, Albertville; Lloyd E. Thorsbakken, Blaine, all of MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/216,303

(22) Filed: Dec. 18, 1998

(51) Int. Cl.[7] .............................. G06F 3/00; H04L 1/22; H04B 1/74
(52) U.S. Cl. .............................. 710/3; 714/42; 714/44; 714/49; 714/53
(58) Field of Search ................................. 714/5, 11, 19, 714/42, 48, 49, 53, 44

(56) References Cited

U.S. PATENT DOCUMENTS

| | | | | |
|---|---|---|---|---|
| 4,233,682 A | * | 11/1980 | Liebergot et al. | 371/68 |
| 4,234,955 A | | 11/1980 | Jeremiah et al. | 371/51 |
| 4,774,712 A | * | 9/1988 | Lewis | 371/51 |
| 4,866,604 A | * | 9/1989 | Reid | 364/200 |
| 4,866,717 A | * | 9/1989 | Murai et al. | 371/40.3 |
| 5,339,408 A | * | 8/1994 | Bruckert et al. | 395/575 |
| 5,392,302 A | | 2/1995 | Kemp et al. | 371/51.1 |
| 5,590,278 A | | 12/1996 | Barthel et al. | 395/185.06 |
| 5,751,740 A | * | 5/1998 | Helbig, Sr. | 371/37.1 |
| 5,768,294 A | | 6/1998 | Chen et al. | 371/37.1 |
| 5,809,543 A | * | 9/1998 | Byers et al. | 711/162 |

* cited by examiner

Primary Examiner—Thomas Lee
Assistant Examiner—Chun Cao
(74) Attorney, Agent, or Firm—Beth L. McMahon; Charles A. Johnson; Mark T. Starr

(57) ABSTRACT

An improved fault detection system and method for detecting the occurrence of faults within the addressing logic of a storage device is provided. Data stored to a selected address within a storage device includes a copy of the selected address. During a subsequent read operation, the copy of the address is read from memory and compared to the read address used to perform the memory access. If the addresses are not the same, a potential addressing fault occurred within the control logic of the storage device. The fault detection system is particularly adaptable for use with storage devices having a relatively small number of addressable locations, each containing a relatively large number of bits. According to one embodiment of the invention, the storage device is a General Register Array (GRA) utilized as a queue.

21 Claims, 3 Drawing Sheets

SYSTEM AND METHOD FOR DETECTING FAULTS IN STORAGE DEVICE ADDRESSING LOGIC

BACKGROUND OF THE INVENTION

1. Field of the Invention

This invention relates generally to a system for detecting operational faults in a memory device; and, more specifically, relates to a system and method for detecting faults occurring in the addressing logic of storage devices such as General Register Arrays (GRAs).

2. Description of the Prior Art

Many of today's data processing systems are used in applications that require a high-degree of fault protection. For example, data processing systems now provide the infrastructure that supports everything from modem banking applications, flight control systems, public utilities, and health care facilities. Ensuring that adequate fault detection is available within these systems is of vital importance.

Various techniques have been devised to provide fault detection. For example, data and address signals may be protected using parity codes. Parity codes are generally generated on data and/or address signals at a source point prior to the transmission of the signals. Parity is then re-generated at some destination point, and the re-generated codes are compared to the originally-generated codes to verify that errors have not occurred during signal transmission. This type of system is described in U.S. Pat. No. 5,392,302 to Kemp et al. The disclosed system utilizes gray code counters to generate parity on an address that is to be transferred to a storage array. The parity code is re-generated after the address is transferred to the storage array, and the two codes are compared. If the codes are unequal, an address error is indicated.

While the use of parity codes is generally employed to protect the integrity of data and address paths, this type of error detection is typically not used for control path signal levels. This is due, in part, because unlike address and data signals, control signals generally do not share common source and destination points, and common switching times. This makes generating parity codes on a given set of control signals impractical.

One method of fault detection more commonly used in the protection of control path signal levels involves the use of redundancy. A circuit employing this method of fault detection duplicates critical sections of the logic so that signal levels from the duplicated nets can be compared. If signal levels differ, an error occurred within one of the duplicated logic sections, and fault correction techniques can be applied, if available, to obtain corrected levels. A system employing logic duplication is shown in U.S. Pat. No. 4,233,682 to Liebegot et al. According to this system, duplicate functional logic is employed to implement selected portions of a logic design. Signal levels are compared at key points within the logic to detect both transient and hard failures.

Another system employing redundancy is described in U.S. Pat. No. 5,809,543 to Byers et al., which is assigned to the assignee of the current invention. The disclosed storage system utilizes redundantly stored data signals and redundant data paths and control logic to achieve a fault-tolerant memory complex.

Although the use of redundant logic may be employed to detect faults occurring in control paths, this method may significantly increase the number of circuits required to implement a logic design. For this reason, the use of redundant logic is not a practical means of accomplishing fault detection when space considerations are a priority, and may also be undesirable if power consumption is to be limited. Additionally, the use of redundant logic is not viable when the signals to be verified are included within "off-theshelf" logic functions.

Off-the-shelf logic functions may be included within discrete components used in board-level designs, and may also be provided as pre-packaged logic functions that are used in the development of custom and semi-custom silicon device designs. In either instance, the logic included within these pre-packaged logic functions may not be modified by an end user. Thus, the end user may not selectively add redundant logic and compare circuits to implement fault detection.

Memory components are a commonly selected off-the-shelf function. Such components include Random Access Memories (RAMs), Read Only Memories (ROMs), and General Register Arrays (GRAs). These devices may be embodied as discrete components, or as logic functions that are selectively included within a logic design implemented on the die of a custom or semi-custom silicon device. Although the address and data paths associated with these storage devices may be parity protected in the manner discussed above, the internal control circuitry that performs the addressing function is generally not fault protected. This circuitry implements the address decode and enable functions that allow a specific address within the device to be accessed in response to the application of a selected set of address and control signals. A failure within this logic could result in reading from, or writing to, an unexpected addressable location within the memory device. This could cause the retrieval of unexpected data, or may result in data loss.

Because the addressing logic of a storage function is embedded within the off-theshelf logic, selective duplication of this logic is not possible. The addressing function may be fault checked by duplicating the entire device. However, since storage devices generally occupy a significant amount of board space or silicon die area, this is not a desirable solution.

One method of performing fault checking on the internal addressing circuitry of a storage device is described in U.S. Pat. No. 5,768,294 to Chen et al. According to the disclosed system, when data is stored to memory, an Error Correction Code ACC) is also stored that is generated using both the stored data and the address signals. Because the ECC code is calculated using the address signals, a subsequent access to an unexpected address within the storage device will result in an error when the address and data are again used to generate an ECC code that is compared against the originally-stored ECC code. The Chen system is relatively logic intensive, requiring multiple circuits for generating the ECC code, and additional circuits to perform the checking. This is not a practical means for detecting addressing faults in designs in which space limitations are an issue. Additionally, for storage devices that are relatively wide, that is, have a relatively large number of bits per addressable location, the number of ECC bits required to provide fault detection using a system of this type is also relatively large. For example, nine ECC bits are required to provide parity error detection on a group of one hundred and twenty data signals. Thus, within each addressable location, nine additional bits must be provided to store the ECC code. This number of bits may not be available.

What is needed is a system and method for detecting faults in the addressing logic of storage devices that can be employed with off-the-shelf functions, that do not require the duplication of logic circuitry, and that require a minimum number of logic circuits to implement.

Objects

The primary object of the invention is to provide an improved fault detection system and method for detecting addressing faults occurring within the addressing logic of storage devices;

A further object of the invention is to provide a fault detection system and method for preventing corrupted data that is parity-correct from penetrating a data processing system;

A further object of the invention is to provide a fault detection system that is capable of detecting addressing faults without the duplication of logic;

A yet further object of the invention is to provide a fault detection system for detecting addressing faults, wherein the system requires a minimum number of logic circuits to implement;

Another object of the invention is to provide a fault detection system for detecting addressing faults, wherein the system requires the use of a minimal number of bits per addressable location to implement the fault detection scheme;

A still further object of the invention is to provide a fault detection system that is particularly adaptable for use with storage devices having a relatively small number of addressable locations, while at the same time having a large number of bits included within each addressable location;

A yet further object of the invention is to provide a fault detection system that can isolate the location of a fault occurring within the addressing logic of a storage device; and A still further object of the invention is to provide a fault detection system and method that can be employed to detect faults occurring in the addressing logic of off-theshelf storage functions.

These and other more detailed and specific objectives of the invention will become apparent from the following description of the invention.

SUMMARY OF THE INVENTION

The objectives of the present invention are achieved in an improved fault detection system and method for detecting the occurrence of faults within the addressing logic of a storage device. When data is stored to a selected address within the storage device, a copy of the address is stored with the data. During a subsequent read operation, the copy of the address is read from memory and compared to the read address used to perform the memory access. If the compared addresses are not the same, a potential addressing fault occurred within the control logic of the storage device.

According to one embodiment of the invention, the storage device is a General Register Array (GRA) used as a circular queue. External logic used to address the GRA includes two stored copies of the next GRA address that is to be written. The first copy of this address is used to address the GRA during a write operation, and the second copy of the address provides the address signals that are written to the GRA along with the write data. If a potential address fault is detected when data signals are read from the GRA, the two stored copies of the write address are compared to determine whether the fault is likely caused by a failure in logic that is external to the GRA, or is the result of a failure within the addressing logic of the GRA. In a similar manner, the external logic may maintain two copies of the next GRA address that is to be read. The first copy is used to address the GRA during a read operation, and the second copy is compared against the address signals that are read from the GRA. In the event a potential address fault is detected during this compare operation, the two external copies of the read address may be compared. If the two external address copies do not compare, the fault is likely caused by a failure in the logic external to the GRA, instead of being caused by addressing logic within the GRA itself Still other objects and advantages of the present invention will become readily apparent to those skilled in the art from the following detailed description of the preferred embodiment and the drawings, wherein only the preferred embodiment of the invention is shown, simply by way of illustration of the best mode contemplated for carrying out the invention. As will be realized, the invention is capable of other and different embodiments, and its several details are capable of modifications in various respects, all without departing from the invention. Accordingly, the drawings and description are to be regarded to the extent of applicable law as illustrative in nature and not as restrictive.

BRIEF DESCRIPTION OF THE FIGURES

The present invention will be described with reference to the accompanying drawings.

DETAILED DESCRIPTION OF THE PREFERRED EMBODIMENTS

Figure 1:
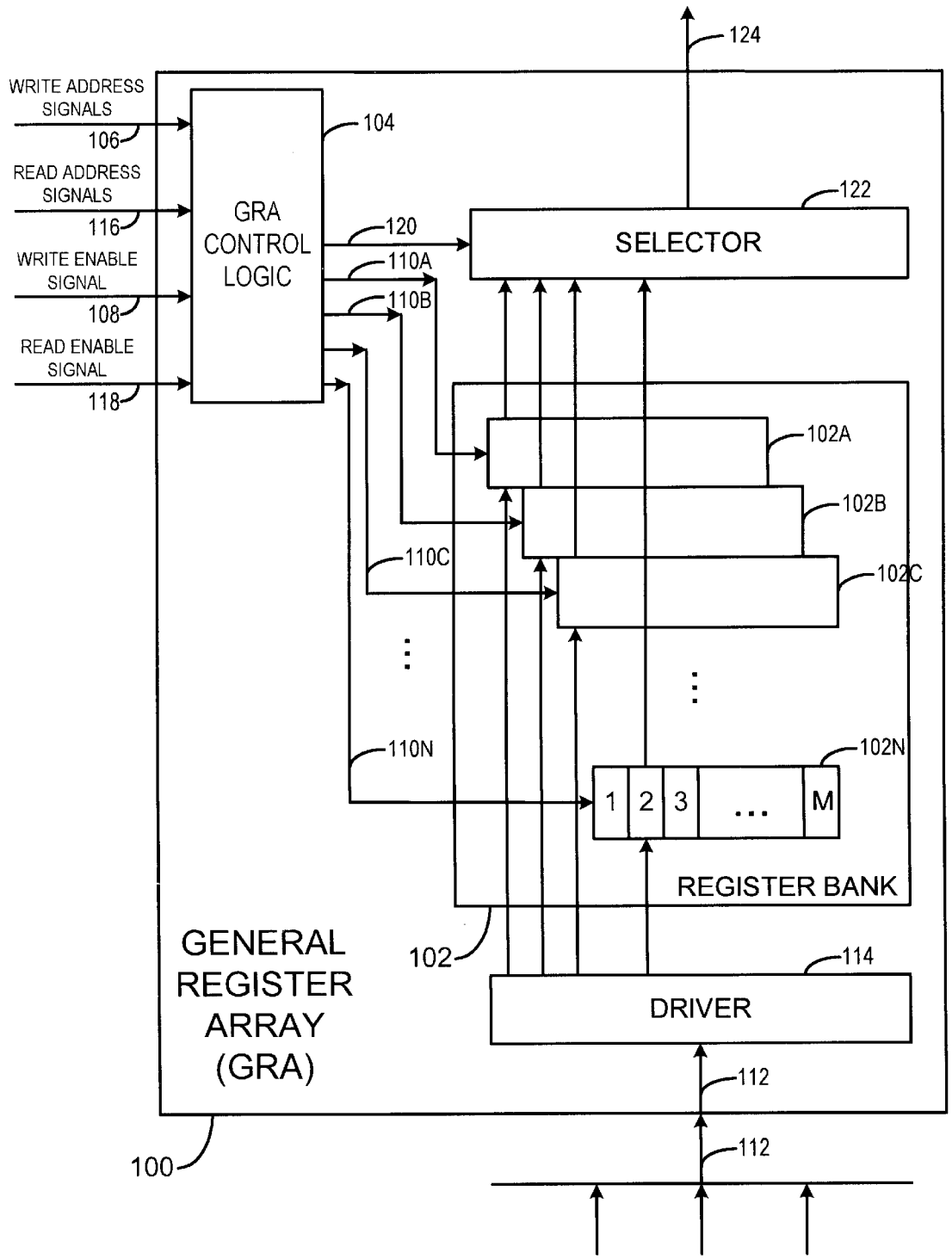
FIG. 1 is a block diagram of the logic included within a General Register Array (GRA)

FIG. 1 is a block diagram of the logic included within General Register Array (GRA) 100. As will be discussed further below, the current invention is best adapted for use with a storage device such as a typical GRA because a device of this type typically has a limited number of addressable locations that each contains a relatively large number of bits. That is, this type of storage device is generally wide, but not very deep. However, various embodiments of the current invention may be adapted for use with any type of storage device, including a RAM or ROM, as will be discussed below.

The block diagram of FIG. 1 includes the address and control logic used to address selectable locations within the GRA 100. The GRA includes a Register Bank 102 including N individually addressable registers shown as Registers 102A, 102B, 102C, through 102N, wherein N is a positive integer. Generally, each register includes the same predetermined number of bits, although this is not a requirement for purposes of the current invention. For exemplary purposes, each register is shown as having M bits, wherein M is a positive integer.

Read and write control for the Register Bank 102 is provided by GRA Control Logic 104. During a write operation, external logic (not shown in FIG. 1) provides GRA Control Logic 104 with Write Address Signals 106 and a Write Enable Signal 108. In response thereto, GRA Control Logic 104 asserts a selected one of the write enable lines shown as Lines 110A, 110B, 110C, or 110N to enable an associated Register 102A, 102B, 102C or 102N, respectively, to store the write data provided by the external logic.

The write data is provided by the external logic on Input Lines 112. The signals on Input Lines 112 are provided to Driver 114, which, in turn, provides the write data to each of the Registers in Register Bank 102. Write data is stored by the addressed one of the Registers when the respective write enable line (a selected one of Lines 110A, 110B, 110C or 110N) is asserted by GRA Control Logic 104.

In a similar manner, during a read operation, external logic provides GRA Control Logic 104 with Read Address Signals 116. According to some storage device designs, Read Enable Signal 118 may also be required to indicate the presence of valid address signals. In response thereto, GRA Control Logic 104 provides Selection Control Signals to Selector 122 on Line 120. This causes Selector to gate the contents of a selected one of the Registers 102A, 102B, 102C, through 102N to the external logic on Selector Output Line 124.

The data stored within each of the Registers in Register Bank 102 may be parity protected. That is, the data signals stored within each Register of the GRA may be associated with one or more parity bits. These parity bits may be stored along with the data in the GRA, or may be stored in a separate storage device (not shown). These bits may be used to detect the occurrence of corrupted data during a GRA read operation. However, the GRA does not provide fault detection circuitry to detect the occurrence of a fault within GRA Control Logic 104. If a fault occurs during a write operation, GRA Control Logic 104 could generate an incorrect signal on write enable lines shown as Lines 110A, 110B, 110C, through 110N. This will result in data signals being stored within an unexpected one of the Registers shown as Registers 102A, 102B, 102C through 102N. Similarly, a failure within GRA Control Logic 104 or Selector 122 during a read operation could result in an incorrect one of the Registers being read. The external logic will be unable to detect the occurrence of either of the foregoing errors. In particular, during a read operation, data may be provided with correct parity to the external logic despite the occurrence of the undetected addressing error, and the external logic will therefore handle the data as if it were uncorrupted.

Figure 2:
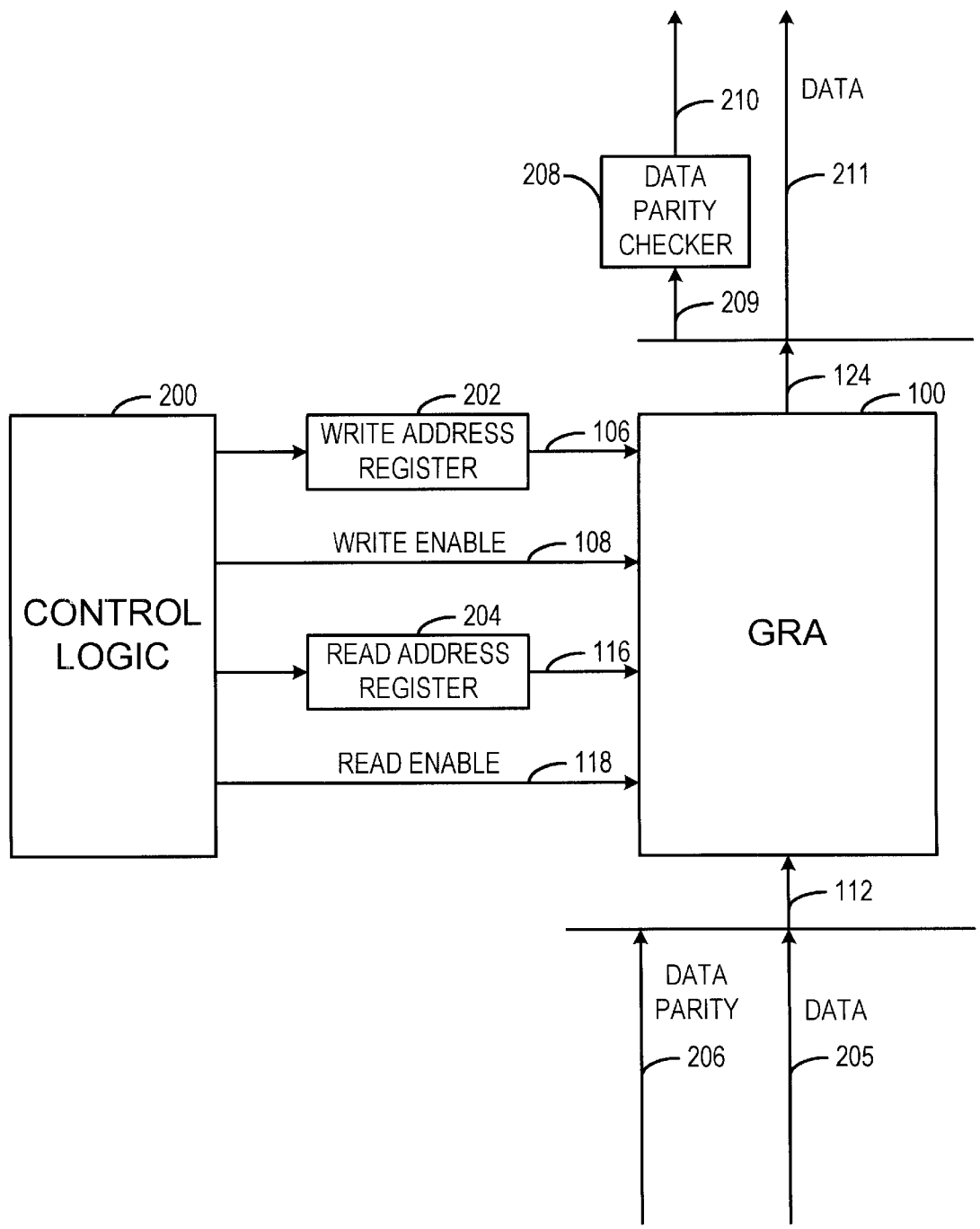
FIG. 2 is a block diagram of prior art logic utilizing a GRA.

FIG. 2 is a block diagram of prior art logic utilizing General Register Array (GRA) 100. Control Logic 200 controls the read and write operations performed to GRA 100. According to one embodiment, GRA 100 is utilized as a circular FIFO. In this configuration, Write Address Register 202 and Read Address Register 204 are initialized to the same predetermined GRA address at system initialization time. After data is written to GRA 100, counter logic (not shown) included within Control Logic 200 increments Write Address Register 202. Similarly, after data is read from GRA 100, the counter logic included within Control Logic 200 increments Read Address Register 204. If the contents of either Write Address Register 202 or the Read Address Register 204 points to the last register in GRA 100, subsequent address incrementation adjusts the register contents to point to the first register in the GRA to thereby implement the circular FIFO. When the Write Address Register 202 points to the same GRA register as the Read Address Register 204, the GRA is empty, and Control Logic 200 will not initiate a read operation. Likewise, when incrementation of the Read Address Register 204 will cause the contents of that register to be the same as the contents of the Write Address Register 202, the GRA is full, and Control Logic 200 will not initiate a write operation until one of the registers within the GRA 100 becomes available for use.

As discussed above, Control Logic 200 controls incrementation of Write Address Register 202 or Read Address Register 204 following a write or read operation, respectively. Also during a write or read operation, Control Logic 200 provides either the Write Enable Signal 108 or the Read Enable Signal 118, respectively, to enable the appropriate operation within GRA 100. Write data signals are provided on data lines shown collectively as Line 205 during a write operation. These write data signals may be associated with parity signals shown collectively being provided on Line 206. The parity signals and write data signals are concatenated and provided to the GRA on Input Lines 112.

During a read operation, the read data signals and any parity signals are provided on Selector Output Lines 124. If parity signals are stored in GRA 100 with the associated data signals, the parity signals may be provided to Data Parity Checker 208 on Lines 209 to be used in verifying that parity on the read data is correct. Error signal 210 is generated if a parity error is detected, with data signals being provided on Lines 211. As discussed above, this logic design will not detect a fault occurring within the address logic of GRA 100.

Figure 3:
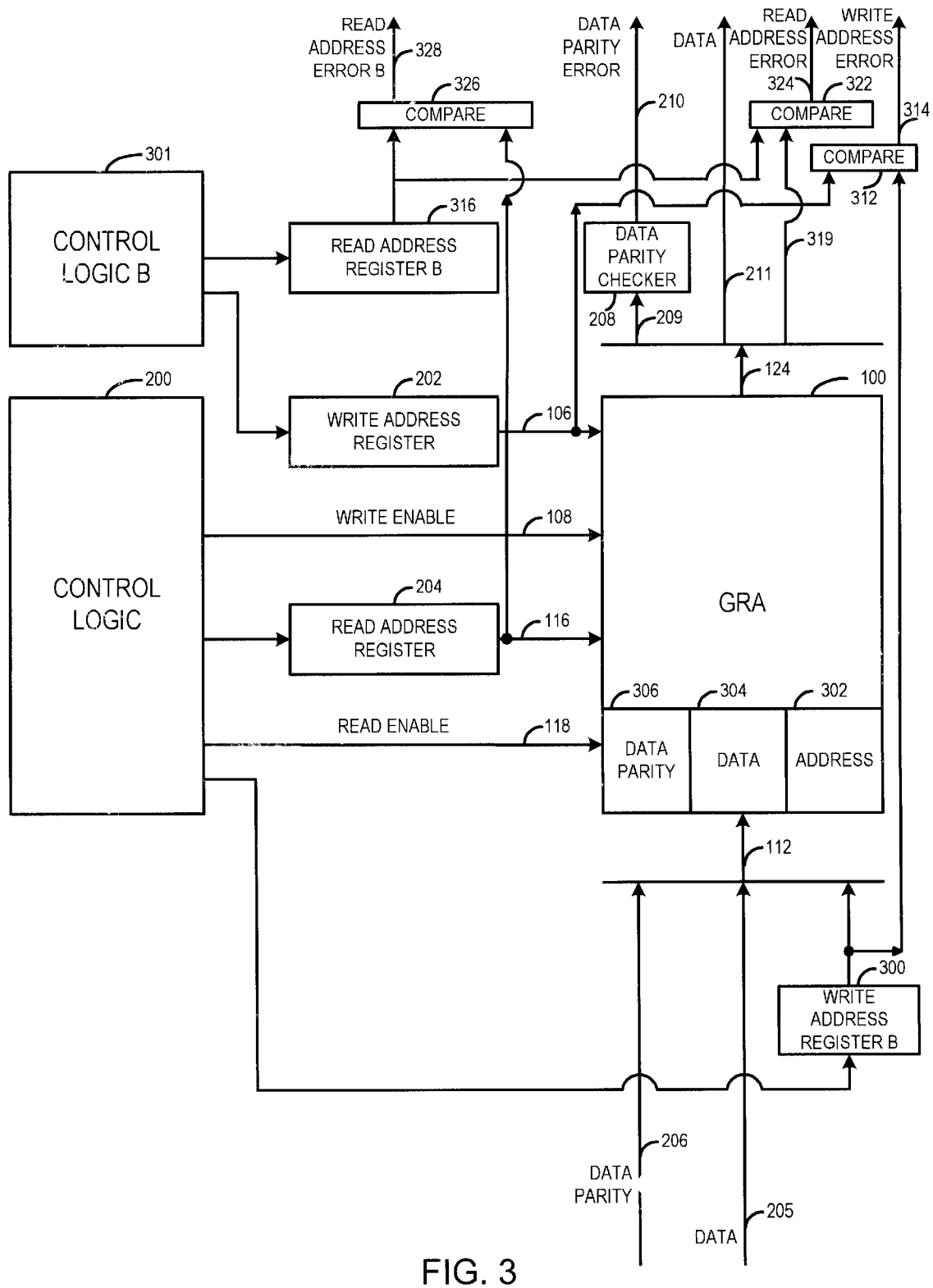
FIG. 3 is a block diagram of the control circuitry for accessing a GRA, and includes circuitry for detecting a fault within the address circuitry of the GRA.

FIG. 3 is a block diagram of the control circuitry for accessing GRA 100 as shown in FIG. 2, and further includes circuitry for detecting a fault within the address circuitry of the GRA according to the present invention. According to one embodiment, the address fault detection circuitry includes a register for storing another copy of the GRA write address, shown as Write Address Register B 300. Write Address Register B 300 is initialized and incremented at the same time as Write Address Register 202. At all times, the two registers maintain an identical copy of the address used to access the GRA during a write operation.

In the preferred embodiment, the functionality provided by Control Logic 200 is duplicated as Control Logic B 301. Control Logic B 301 is shown coupled to provide incrementation and control for Write Address Register 202. Control Logic 200 provides the incrementation and control for Write Address Register B 300. Control Logic 200 and Control Logic B 301 perform the same operations substantially simultaneously to maintain identical addressing signals in Write Address Register 202 and Write Address Register B 300 in the manner discussed above. The use of redundant control logic is not necessary for the detection of addressing faults within GRA 100. That is, in an alternatively embodiment, Control Logic 200 could be employed to control incrementation in both Write Address Register 202 and Write Address Register B 300 without sacrificing the capability to detect faults in the addressing logic of GRA 100. However, the use of redundant control logic allows more sophisticated fault isolation to be performed in a manner to be described below.

The address signals stored in Write Address Register B are concatenated with Data Signals shown provided on Line 205, may further be concatenated with data parity signals shown on Line 206, and are provided on Input Lines 112 to GRA 100. Whenever data is written to a particular addressable location within the GRA, the address for that addressable location is also stored as another field along with the data. The Address Signals are shown being stored in Field 302 of GRA 100, with Data Signals being stored in Field 304, and Data Parity Signals being stored in Field 306. Compare Circuit 312 generates Write Address Error Signal 314 if the contents of Write Address Register 202 and Write Address Register B 300 are not the same. The use of this signal will be discussed below.

When data is read from GRA 100, the address signals stored in Field 302 are read from GRA along with the data.

The address signals are provided on Line 319 to Compare Circuit 322. These address signals are compared against the address signals stored in Read Address Register B 316. If the two addresses are not the same, Read Address Error Signal 324 is generated. This signal indicates a potential fault within the addressing logic of GRA 100. The contents of Read Address Register B 316 may also be provided to Compare Circuit 326 to be compared against the contents of Read Address Register 204. If the two addresses are not the same, Read Address Error Signal B 328 is generated to indicate a potential fault in logic external to the GRA 100.

According to the embodiment shown in FIG. 3, Control Logic B 301 provides incrementation and control for Read Address Register B 316, whereas Control Logic 200 provides incrementation and control for Read Address Register 204. Both Read Address Register 204 and Read Address Register B 316 may be controlled by the same control logic, for example, Control Logic 200. However, as discussed above, the use of redundant control logic allows more complete fault isolation to be performed.

The various parity and address error signals may be provided to a fault controller (not shown) using scan-set or other error reporting logic as is known in the art. These signals may be analyzed to isolate the location of the fault. For example, if both Read Address Error Signal 324 and Read Address Error Signal B 328 are asserted, an error likely occurred in the logic that is external to GRA 100. That is, the contents of either Read Address Register 204 or Read Address Register B 316 are corrupted. This may be the result of a failure in the register itself, or may be the result of a fault in the corresponding control logic, either Control Logic 200 or Control Logic B 301. If Read Address Error Signal 324 is asserted but Read Address Error B Signal 328 is not asserted, addressing logic within GRA 100 is likely faulty. That is, data was either written to, or read from, the wrong address within GRA 100 because GRA Control Logic 104 did not operate properly. Finally, if Write Address Error Signal 314 is asserted, it is likely the contents of either Write Address Register 202 or Write Address Register B 300 are corrupted, either as a result of a register failure or a failure in the corresponding control logic, either Control Logic 200 or Control Logic B 301.

If the current design is implemented with discrete components, the error analysis could be helpful in determining which component or components to replace. In a more likely scenario, the current design will be implemented within a custom or semi-custom silicon device, and the occurrence of any of the error signals may signal the necessity to replace the entire device. It may be noted that if the entire design is implemented within a silicon device, an alternate embodiment of the invention may be used wherein both Write Address Register B 300 and Read Address Register B 316 may be eliminated, along with Compare Circuits 312 and 326. In this case, Write Address Register 202 provides the address to the GRA 100, and Read Address Register 204 provides the read address to Compare Circuit 322. Although this embodiment does not isolate the fault to either the external logic or to the GRA, this is not important because the occurrence of either fault will necessitate the replacement of the silicon device. The use of this alternative embodiment may also be desirable in designs in which space considerations are of primary importance.

The above description discusses the use of the current invention in a system utilizing GRA 100. The invention is easily adapted for use with this type of storage device, which generally has a limited number of storage locations addressable with a relatively few number of address bits. For example, only four bits are required to address a GRA having sixteen addressable locations. If each addressable GRA location is relatively wide, considerably fewer bits will be required to store the GRA address in accordance with the present invention than to store an ECC code calculated on the data and address fields of an addressable GRA location in the manner discussed above. For example, a nine-bit ECC code is required to provide parity protection on one hundred and twenty signals that may include both data signals stored in the GRA and address signals used to address the GRA.

Although the current invention is most readily adapted for use with storage devices that are both relatively wide, and also have relatively few addressable locations, the invention may also be adapted for use in verifying the addressing logic within any type of storage device, including but not limited to, Read Only Memories (ROMs), Random Access Memories (RAMs), Dynamic Random Access Memories (DRAMs), and the like. When the current invention is practiced with ROMs, the address data that is to be associated with each address location must be provided at the time the data is initially entered into the device. Storing the entire address becomes less desirable as the number of address bits needed to address a location within a particular storage device increases, thereby occupying more space within each storage location.

According to yet another embodiment, the invention may be practiced on a predetermined address range within a storage device. For example, this could be accomplished by selectively enabling Compare Circuits 322 and 326 for read operations occurring to addresses within the desired address range. This may be desirable if storage requirements dictate that for certain address ranges, memory space is not available within each storage location for address signals.

While various embodiments of the present invention have been described above, it should be understood that they have been presented by way of example only, and not as a limitation. Thus, the breadth and scope of the present invention should not be limited by any of the above-described exemplary embodiments, but should be defined only in accordance with the following claims and their equivalents.

What is claimed is:

1. A system for verifying addressing logic included in a storage device, wherein the storage device includes a plurality of addressable locations each for storing data signals, and wherein predetermined ones of the addressable locations stores, as ones of the data signals, address signals indicative of the address for the respective one of the predetermined ones of the addressable locations, the system, comprising:

read addressing means for providing a read address to the storage device to read a selectable one of the addressable locations within the storage device; and read address compare means coupled to said read addressing means for receiving said read address, for receiving the address signals from said selectable one of the addressable locations if said selectable one of the addressable locations is one of the predetermined ones of the addressable locations, and for generating a read address error indicator if said read address has a predetermined relationship to said address signals from said selectable one of the addressable locations.

2. The system of claim 1, and further including write addressing means for causing the storage device to store data signals at a write address that is a selectable one of the plurality of addressable locations.

3. The system of claim 2, and further including write address register means coupled to said write addressing means for providing to the storage device as ones of said data signals a copy of said write address for any write address that is one of the predetermined ones of the addressable locations.

4. The system of claim 3, and further including write address compare means coupled to said write address register means for comparing said write address with said copy of said write address and for generating a write address error if said write address has a predetermined relationship to said copy of said write address.

5. The system of claim 1, wherein said read addressing means includes first register means for providing said read address to the storage device, and wherein said read addressing means further includes second register means for providing said read address to said compare means.

6. The system of claim 5, and further including second read address compare means for generating a second read address error indicator if said read address provided by said first register means has a predetermined relationship to said read address provided by said second register means.

7. The storage system, comprising:
   a storage device having a predetermined plurality of addressable locations, each of said addressable locations to store data signals that include a respective address for addressing said each of said addressable locations;
   a read control circuit coupled to said storage device to provide a selectable read address to said storage device to read data signals stored at said selectable read address; and
   a read address compare circuit coupled to said read control circuit and said storage device to generate a read address error signal if said selectable read address and said respective address included in said data signals stored at said selectable read address have a predetermined relationship.

8. The storage system of claim 7, wherein said read address compare circuit includes circuits to generate said read address error signal if said selectable read address and said respective address included in said data signals stored at said selectable read address are not the same address.

9. The storage system of claim 7, wherein said read control circuit includes a first read address register to provide said selectable read address to said storage device, and a second read address register to provide said selectable read address to said read address compare circuit.

10. The storage system of claim 9, and further including a second read address compare circuit coupled to said read control circuit to generate a second read address error signal if said selectable read address provided by said first read address register has a predetermined relationship to said selectable read address provided by said second read address register.

11. The storage system of claim 7, and further including a write control circuit coupled to said storage device to provide a selectable write address to said storage device to write data signals to said selectable write address.

12. The storage system of claim 11, and further including a write address register coupled to said storage device to provide as ones of said write data signals a copy of said selectable write address.

13. The storage system of claim 12, and further including a write address compare circuit coupled to said write control circuit and coupled to said write address register to generate a write address error signal if said selectable write address and said copy of said selectable write address have a predetermined relationship.

14. The storage system of claim 12, and further including a write address compare circuit coupled to said write control circuit and coupled to said write address register to generate a write address error signal if said selectable write address and said copy of said selectable write address are not the same.

15. The storage system of claim 7, wherein said storage device is a General Register Array.

16. The storage system of claim 7, wherein said storage device includes circuits to store parity signals generated for predetermined ones of said data signals.

17. A method for verifing addressing logic included within a storage device, comprising the steps of:
   storing data signals to a selectable address within the storage device, said data signals including address signal indicative of said selectable address;
   reading said data signals from said selectable address within the storage device;
   comparising said selectable address to said address signals that are included in said data signals read from the storage device; and
   generating a read address error signal if said selectable address has a predetermined relationship to said address signals.

18. The method of claim 17, wherein said storing step includes the steps of:
   generating a first copy of said selectable address for use in addressing the storage device during a store operation; and
   generating a second copy of said selectable address for use in writing said address signals indicative of said selectable address to the storage device.

19. The method of claim 18, and further including the step of generating a write address error signal if a predetermined relationship exists between said first copy of said selectable address and said second copy of said selectable address.

20. The method of claim 17, wherein said reading step includes the steps of:
   generating a first copy of said selectable address for use in addressing the storage device during a read operation; and
   generating a second copy of said selectable address for use in said determining step in determining whether said selectable address has a predetermined relationship to said address signals that are included in said data signals read from the storage device.

21. The method of claim 20 and further including the steps of:
   comparing said first copy of said selectable address to said second copy of said selectable address; and
   generating a read address error signal if a predetermined relationship exists between said first copy of said selectable address and said second copy of said selectable address.

* * * * *